United States Patent
Kawase et al.

[11] Patent Number: 6,007,622
[45] Date of Patent: Dec. 28, 1999

[54] METHOD OF PREPARING GROUP III-V COMPOUND SEMICONDUCTOR CRYSTAL

[75] Inventors: Tomohiro Kawase; Masami Tatsumi, both of Hyogo, Japan

[73] Assignee: Sumitomo Electric Industries, Ltd., Osaka, Japan

[21] Appl. No.: 08/843,124

[22] Filed: Apr. 25, 1997

[30] Foreign Application Priority Data

Apr. 26, 1996 [JP] Japan .................................... 8-107009

[51] Int. Cl.⁶ .................................................. C30B 11/04
[52] U.S. Cl. .................................. 117/82; 117/83; 117/4; 117/6; 117/7; 117/953
[58] Field of Search ................................ 117/82, 953, 4, 117/6, 7

[56] References Cited

U.S. PATENT DOCUMENTS

| | | |
|---|---|---|
| 4,999,082 | 3/1991 | Kremer et al. . |
| 5,131,975 | 7/1992 | Bourret-Courchesne ............... 117/953 |
| 5,515,810 | 5/1996 | Yamashita .................................. 117/17 |

FOREIGN PATENT DOCUMENTS

| | | |
|---|---|---|
| 0529963 | 3/1993 | European Pat. Off. . |
| 60-210599 | 10/1985 | Japan . |
| 01037833 | 2/1989 | Japan . |
| 64-79087 | 3/1989 | Japan . |
| 02034597 | 2/1990 | Japan . |
| 2-74597 | 3/1990 | Japan . |
| 3-252399 | 11/1991 | Japan . |

OTHER PUBLICATIONS

Journal of Japanese Association of Crystal Growth, Y. Okabe et al. Undoped Semi–Insulating GaAs Single Crystals Grown by VGF Method, vol. 18, 1991, pp. 88–95.

"Low dislocation density and low residual strain semi insulating GaAs grown by vertical boat method". Kawase, T. (Apr. 1996).

Primary Examiner—Robert Kunemund
Attorney, Agent, or Firm—W. F. Fasse; W. G. Fasse

[57] ABSTRACT

A method is provided for preparing, with high reproducibility, a carbon-doped group III–V compound semiconductor crystal having favorable electrical characteristics and having impurities removed therefrom, and in which the amount of doped carbon can be adjusted easily during crystal growth. This method includes the steps of: filling a crucible with compound raw material, solid carbon, and boron oxide; sealing the filled crucible gas impermeable material; heating and melting the compound raw material under the sealed state in the airtight vessel; and solidifying the melted compound raw material to grow a carbon-doped compound semiconductor crystal.

22 Claims, 7 Drawing Sheets

METHOD OF PREPARING GROUP III-V COMPOUND SEMICONDUCTOR CRYSTAL

BACKGROUND OF THE INVENTION

1. Field of the Invention

The present invention relates to a method of preparing a group III–V compound semiconductor crystal. Particularly, the present invention relates to a method of preparing a group III–V compound semiconductor crystal in which carbon is doped.

2. Description of the Background Art

Conventionally, there are various prior arts as set forth in the following regarding the method of preparing a group III–V compound semiconductor crystal in which carbon is doped.

In Japanese Patent Laying-Open No. 64-79087 (referred to as "prior art 1" hereinafter), a method of preparing a carbon-doped GaAs single crystal according to the gradient freeze method or horizontal Bridgman method (HB method) is disclosed.

FIG. 6 is a diagram for describing a method of preparing a carbon-doped GaAs single crystal according to prior art 1.

Referring to FIG. 6, a graphite boat 51 as a carbon source is arranged at one side in a quartz ampoule 55. Raw material which is gallium (Ga) 52 is provided in graphite boat 51. Arsenic (As) 57 is provided at the other side in quartz ampoule 55. Quartz ampoule 55 is sealed in vacuum and then installed in an electric furnace to be heated. After the GaAs raw material is synthesized, the temperature is reduced maintaining a constant temperature gradient, whereby a GaAs single crystal is grown.

The carbon of graphite boat 51 reacts with oxygen supplied from $As_2O_3$, $Ga_2O$ and the like remaining in quartz ampoule 55 to result in gas of CO, $CO_2$ and the like to be doped into the growing GaAs crystal.

It is described that the doping amount of carbon can be controlled according to the total amount of oxygen in the sealed quartz ampoule 55, the synthesization reaction condition, or single crystal growth condition, and the like.

In Journal of the Japanese Association of Crystal Growth, 1991, Vol. 18, No. 4, pp. 88–95 (referred to as "prior art 2" hereinafter), a method of preparing a carbon-doped GaAs single crystal by the vertical gradient freeze method (VGF method) is disclosed.

FIG. 7 is a diagram for describing a method of preparing a carbon-doped GaAs single crystal according to prior art 2.

Referring to FIG. 7, raw material 62 having carbon doped in advance, directly synthesized by the LEC method and boron oxide ($B_2O_3$) 64 are provided in a crucible 61 and sealed in vacuum in a quartz ampoule 65. This is installed in a vertical furnace and heated to melt the raw material and boron oxide. By reducing the temperature in the furnace while maintaining a constant temperature gradient, a GaAs single crystal is grown.

Here, boron oxide containing water of 200 ppm spreads around only the periphery of the upper surface of GaAs melt 62. The center area of the upper surface of GaAs melt 62 is exposed to the ambient. According to the method of prior art 2, the upper surface of the melt must be exposed to the ambient to control the stoichiometry of the GaAs melt. The vapor pressure in quartz ampoule 65 is controlled by arsenic 67.

According to this method, the carbon concentration of the crystal depends on the carbon concentration of the raw material.

In U.S. Pat. No. 4,999,082 (referred to as "prior art 3" hereinafter), a method of preparing carbon-doped GaAs single crystal by the vertical Bridgman method (VB method) is disclosed.

FIG. 8 is a diagram for describing a method of preparing carbon-doped GaAs single crystal according to prior art 3.

Referring to FIG. 8, a crucible 71 is filled with GaAs raw material 72. After carbon source 73 is arranged outside of crucible 71, a quartz ampoule 75 is sealed. Quartz ampoule 75 is placed in a vertical furnace and heated to melt the raw material. The furnace is moved upwards while substantially maintaining the set temperature profile. By solidifying the raw material from a seed crystal 77, a GaAs single crystal is grown.

According to this method, carbon source 73 is in fluid communication with compound raw material 72 to allow gas transfer.

Japanese Patent Laying-Open No. 3-252399 (referred to as "prior art 4" hereinafter) discloses a method of preparing a semi-insulating GaAs substrate.

Prior art 4 is characterized in that the impurity which becomes the acceptor is doped so as to result in $1\sim3\times10^{15}$ atoms/cm$^3$ after subtracting the concentration of the impurity which becomes the donor in a GaAs crystal.

Japanese Patent Laying-Open No. 2-74597 (referred to as "prior art 5" hereinafter) discloses a chromium-doped semi-insulating GaAs single crystal and a method of preparing thereof. This prior art 5 is characterized in that carbon is contained having a concentration $n_c$ that satisfies both the relations of:

$$1\times10^{15}\text{cm}^{-3} \leq n_c < n_{si} \text{ and } n_{si}-n_c \leq 4.4\times10^{15}\text{cm}^{-3}$$

for the residual Si concentration of $n_{si}$ remaining in the single crystal, with the resistivity of at least $10^6 \Omega\cdot$cm.

The above-described prior art have various disadvantages. In prior art 1, boron oxide is not used. Therefore, impurity contamination can be expected. Furthermore, since the amount of the carbon source cannot be controlled in this method, it is difficult to control the carbon concentration.

In prior art 2, carbon cannot be doped during the crystal growth since carbon source is not used. There is a problem that the carbon concentration cannot be adjusted during crystal preparation. Furthermore, a part of the carbon in the GaAs melt reacts with oxygen, that is generated as a result of the water in the boron oxide decomposing, to be lost as CO gas. There was a problem that the carbon concentration in the GaAs crystal is lowered.

In prior art 3, it is difficult to control the carbon concentration since the carbon source is located outside the crucible. Furthermore, impurity contamination can be expected since boron oxide is not used.

In prior art 4, carbon is recited as the impurity serving as the acceptor. However, only the doping of zinc and copper is disclosed as the example. There is no description of carbon doping.

Prior art 5 describes a chromium-doped semi-insulating GaAs single crystal containing carbon. However, this prior art 5 is silent about the method of doping carbon.

SUMMARY OF THE INVENTION

In view of the foregoing, an object of the present invention is to provide a method of preparing in high reproducibility a group III–V compound semiconductor crystal of favorable electrical characteristics having impurities removed, and in which the amount of doped carbon can easily be adjusted during crystal growth.

According to an aspect of the present invention, a method of preparing a group III–V compound semiconductor crystal is provided. This method of preparing a group III–V compound semiconductor crystal having carbon doped includes the steps of: filling a crucible or boat with compound raw material, solid carbon, and boron oxide; sealing the crucible or boat filled with compound raw material, solid carbon, and boron oxide in an airtight vessel formed of a gas impermeable material; heating and melting the compound material in a sealed state in the airtight vessel; and solidifying the melted compound material to grow a carbon-doped compound semiconductor crystal.

Since the crucible or boat is filled with compound raw material, solid carbon, and boron oxide according to the present invention, the boron oxide softened by heating is brought into contact with at least a portion of the solid carbon in the state where the compound raw material is melted.

According to the present invention, the carbon concentration in the raw material does not have to be adjusted since carbon can be doped during crystal growth. Good controllability of the carbon concentration is obtained. In other words, the target carbon concentration can be obtained in high reproducibility. By using boron oxide which has an impurity removal effect, the contamination of impurities in the crystal can be suppressed to obtain a crystal of favorable electrical characteristics.

Quartz or pBN (pyrolytic boron nitride) and the like can be enumerated as the gas impermeable material.

Preferably, boron oxide contains water.

This is because the water in boron oxide is essential to remove impurities. Furthermore, it is considered that the water in the boron oxide effects the incorporation of carbon into the crystal.

Boron oxide preferably contains water of 10–500 wt ppm.

In the present invention, the amount of solid carbon to be filled is preferably larger than the amount of carbon doped into the compound semiconductor crystal.

This is to promote reaction using an excessive amount of carbon since the reaction rate of solid carbon is extremely low. Furthermore, consumption of the part of the solid carbon at the gas generation of the carbon compound must be supplied. Thus, by using solid carbon of an amount larger than the total amount of carbon doped into the crystal, the advantage of the present invention works effectively.

Specifically, the amount of solid carbon must be at least ten times, preferably at least 100 times larger than the weight of the carbon doped into the crystal.

In the present invention, it is preferred that the solid carbon is subjected to a heat treatment under reduced pressure before being filled in the crucible or boat.

By this process, the impurity element remaining in carbon is removed to result in a crystal of higher purity.

The pressure in applying a heat treatment on carbon is preferably from 1 Torr to $1 \times 10^{-8}$ Torr. The appropriate temperature of the heat treatment is 500° C.–2000° C. The above-described effect can be obtained by carrying out the heat treatment for at least one hour. It was found that a greater effect can be obtained as the time for the heat treatment becomes longer. However, there is very little change in the effect when the time for the heat treatment exceeds 12 hours. Considering that the cost for production is increased as the time for the heat treatment becomes longer, the time period for the heat treatment of not more than 12 hours is appropriate.

In the present invention, it is preferable to keep the compound raw material in its melted state for a certain time period before it is solidified for crystal growth.

By this process, the impurities of Si and the like in the GaAs polycrystalline raw material can be removed by gettering with boron oxide. Although Si of approximately $1 \times 10^{16}$ cm$^{-3}$ is included as impurities in the raw material synthesized by the HB method, the amount of Si in the GaAs subjected to the above-described process is less than $1 \times 10^{15}$ cm$^{-3}$, which is below the detection limit of an analyzer. Si of an amount over $1 \times 10^{15}$ cm$^{-3}$ was detected from those not subjected to the above-described process.

Thus, carbon can be sufficiently melted in the GaAs melt from the solid carbon by the above-described process. This process also provides the advantage that the temperature of the GaAs melt is stabilized, and the carbon concentration and impurity concentration in the melt can be made uniform.

The above-described effect can be obtained when the holding time period in the melted state of raw material is at least 3 hours. Further favorable characteristics can be obtained stably when the holding time is at least 6 hours. Although a greater effect can be obtained as the holding time becomes longer, the degree of change in the effect gradually becomes smaller when the holding time period exceeds 36 hours. There is very little change in the effect when the holding time exceeds 72 hours. Considering that the cost for production becomes higher as the holding time is increased, the holding time is preferably not more than 72 hours, further preferably not more than 36 hours.

In the present invention, powder carbon can be used as the solid carbon.

Powder carbon is advantageous in promoting the reaction due to its greater specific surface area. Increase in the reaction speed allows carbon to be doped efficiently in the crystal.

Also, the amount of carbon to be doped into the crystal can easily be adjusted according to the grain size, the weight, and the like of the used powder. For example, powder of a smaller grain size has a greater specific surface area to increase the reaction speed, whereby the amount of doped carbon is increased.

Therefore, the grain size of the powder carbon is preferably smaller. More specifically, the average grain size is preferably not more than 100 $\mu$m, more preferably not more than 50 $\mu$m. When powder carbon is used, the powder carbon spreads in the boron oxide softened by heating in the state where the compound raw material is melted.

In the present invention, fiber carbon, as well as powder carbon, can be used as the solid carbon.

Fiber carbon is advantageous in that the diameter of the fiber is small and a greater surface area can be obtained to result in a faster reaction speed. It is therefore possible to dope carbon into the crystal efficiently. Also, the amount of carbon doped into the crystal can easily be adjusted according to the diameter or weight of the fiber that is used. Uniform distribution of the carbon concentration can be obtained from the shoulder to the tail of the prepared crystal when fiber carbon is used.

The diameter of the fiber carbon is preferably smaller. Specifically, the average diameter is preferably not more than 50 $\mu$m, more preferably not more than 10 $\mu$m.

Usage of fiber carbon allows carbon to spread in boron oxide that is softened by heating in the state where the compound raw material is melted. Also, the carbon can float above boron oxide to be exposed to the ambient.

In the present invention, bulk carbon can be used as solid carbon, in addition to powder carbon and fiber carbon.

Bulk carbon is advantageous in that the amount of carbon to be doped in the crystal can easily be adjusted by the weight and configuration of the carbon used. Uniform distribution of carbon concentration can be obtained from the shoulder to the tail of the prepared crystal when bulk carbon is used.

Bulk carbon is preferably used in a disk shape that is smaller than the inner diameter of the crucible. The amount of doped carbon can easily be controlled by the diameter of the disk.

The bulk solid carbon is preferably a sintered compact of carbon powder. The reaction speed is particularly high for the sintered compact of powder having high porosity. Sintered carbon powder is advantageous in distributing carbon uniformly in the crystal.

When bulk solid carbon is used, a state can be obtained in which at least a portion of the bulk solid carbon is immersed in the softened boron oxide.

In the present invention, the crucible or boat is preferably formed of pBN (pyrolytic boron nitride).

Depending upon the constituent element of the crucible or boat, there is a possibility that boron oxide or carbon reacts with the crucible to induce contamination of the raw material melt. pBN is most appropriate as the material of the crucible or boat to suppress reaction with boron oxide or carbon.

The present invention is particularly effective as a method of doping carbon into a GaAs crystal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
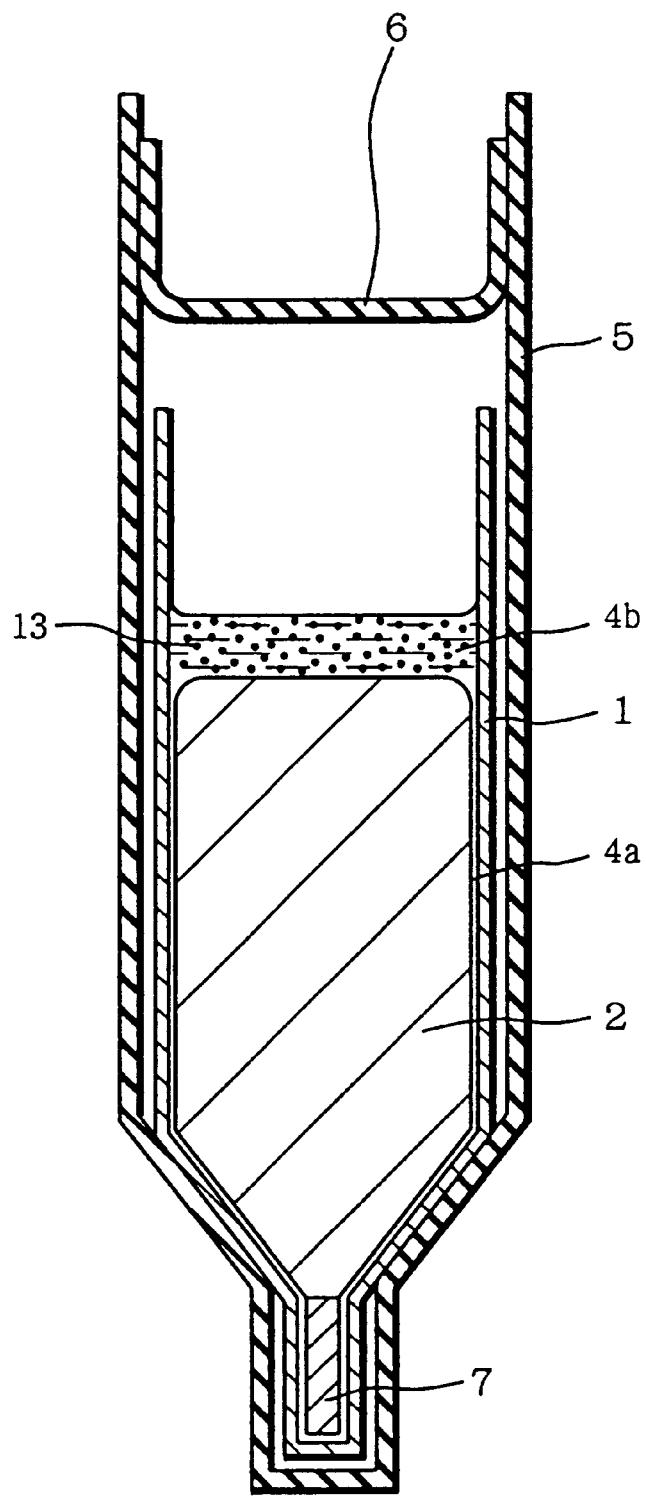
FIG. 1 is a diagram for describing an example of a method of preparing a group III–V compound semiconductor crystal according to the present invention.

FIG. 1 is a diagram for describing an example of preparing a group III–V compound semiconductor crystal according to the present invention.

Referring to FIG. 1, GaAs polycrystalline raw material 2, carbon powder 13 subjected to heat treatment under reduced pressure in advance, boron oxide ($B_2O_3$) 4, and a seed crystal 7 were placed in a pBN crucible 1. The seed crystal was placed at the bottom portion of the crucible 1. In crucible 1, arrangement was provided so that carbon powder 13 and boron oxide 4 were brought into contact with each other, and also boron oxide 4 and raw material 2 were brought into contact with each other when the raw material was melted.

Crucible 1 was inserted in a quartz ampoule 5 together with solid arsenic. Ampoule 5 was sealed under reduced pressure with a quartz cap 6.

Respective conditions of Example 1 are shown in the following Table 1.

TABLE 1

| GaAs polycrystal (raw material) | 3 kg used |
|---|---|
| Carbon powder | 350 mesh (grain size 45 μm and below), 100 mg used Heat treatment at 1000° C. for 6 hours at the pressure of $10^{-2}$ Torr |
| $B_2O_3$ | Water concentration 50 wt ppm, 50 g used |
| pBN crucible | Inner diameter 80 mm, entire length 250 mm |
| Solid arsenic | 1 g used |

Figure 2:
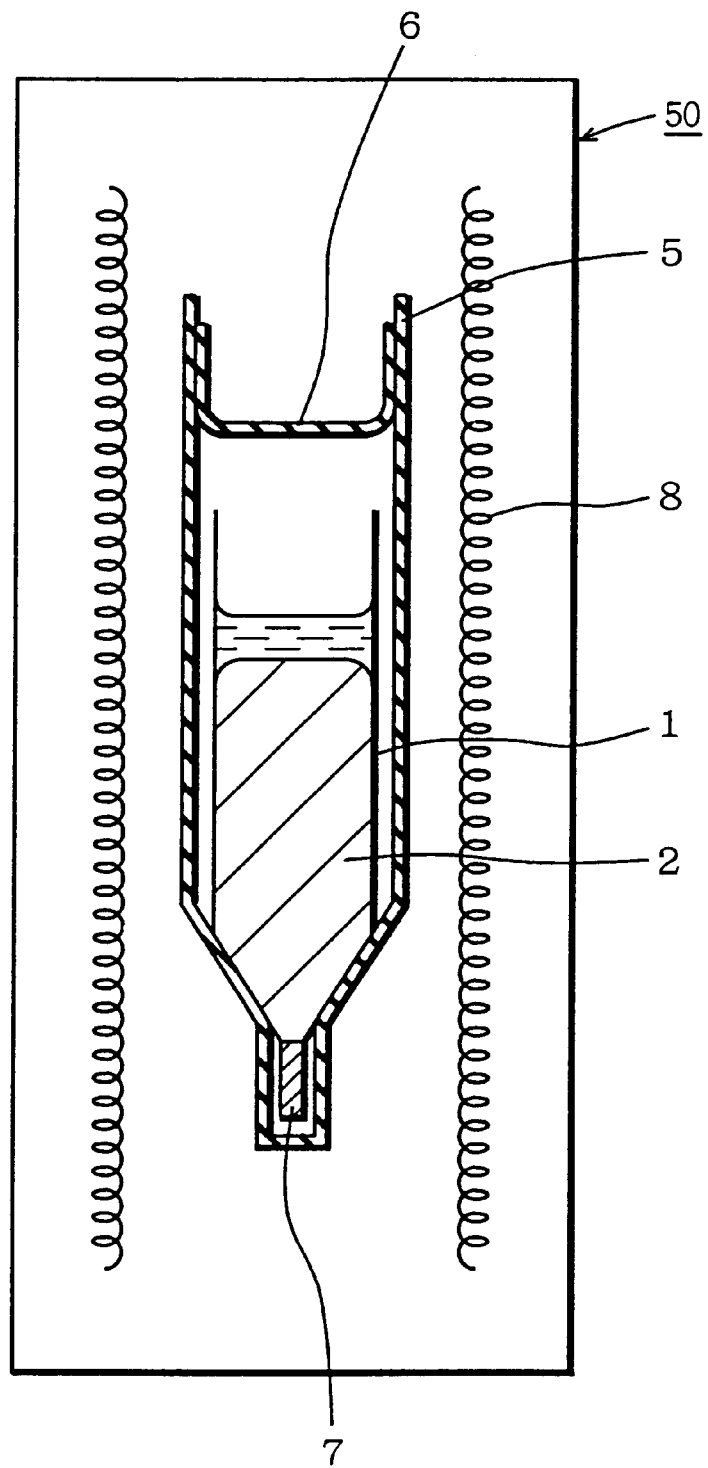
FIG. 2 is a diagram showing the state of carrying out crystal growth using a vertical furnace.

Referring to FIG. 2, the above-described quartz ampoule 5 was heated at the rate of approximately 200° C./hour by a heater 8 using a vertical furnace 50.

During this process of heating, boron oxide 4 was softened and melted. Also, GaAs polycrystalline raw material 2 was melted.

At this time point, boron oxide 4 was present as a film 4a having a thickness of less than 1 mm between pBN crucible 1 and GaAs raw material melt 2. The remainder of boron oxide 4 covered the upper surface of GaAs melt 2. The thickness of the boron oxide layer 4b covering the upper surface of GaAs melt 2 was approximately 5 mm. Carbon powder 13 was dispersed in this boron oxide layer 4b.

The condition mentioned above was kept for approximately 36 hours.

Then, heater 8 was moved upwards at the rate of 4 mm/hour, whereby solidification started from the portion of seed crystal 7. Thus, a single crystal was grown. The characteristics of the obtained single crystal is shown in the following Table 2.

TABLE 2

| Crystal diameter | 80 mm | |
|---|---|---|
| Length of φ80 mm portion | 100 mm | |
| Carbon concentration | Shoulder | $1.4 \times 10^{15}$ cm$^{-3}$ |
| | Tail | $0.8 \times 10^{15}$ cm$^{-3}$ |
| Resistivity | Shoulder | $2.9 \times 10^7$ Ωcm |
| | Tail | $1.5 \times 10^7$ Ωcm |
| Dislocation density | Shoulder | 900 cm$^{-2}$ |
| | Tail | 1200 cm$^{-2}$ |

Figure 5:
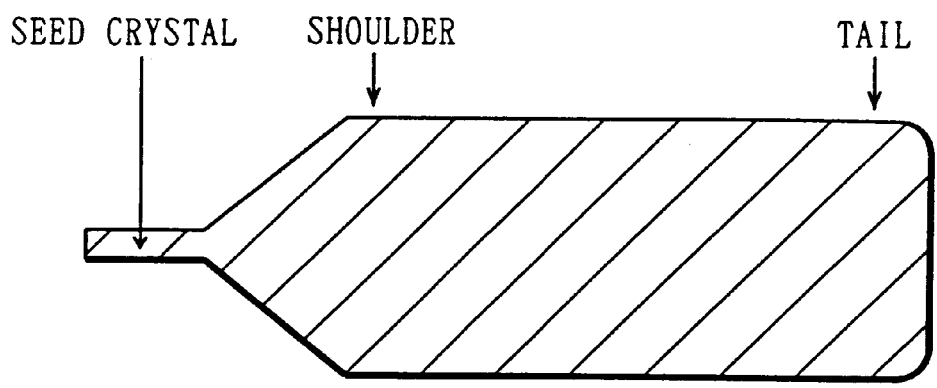
FIG. 5 is a diagram for describing each portion of a crystal.
Figure 6:
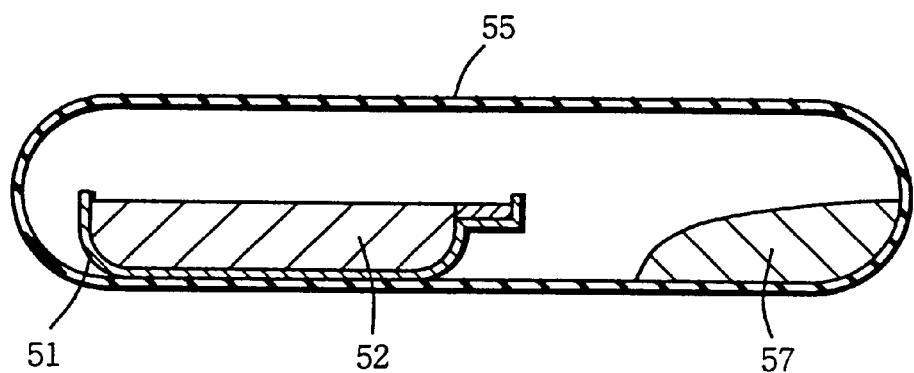
FIG. 6 is a diagram for describing a method of preparing a carbon-doped group III–V compound semiconductor crystal single crystal according to an example of prior art.
Figure 7:
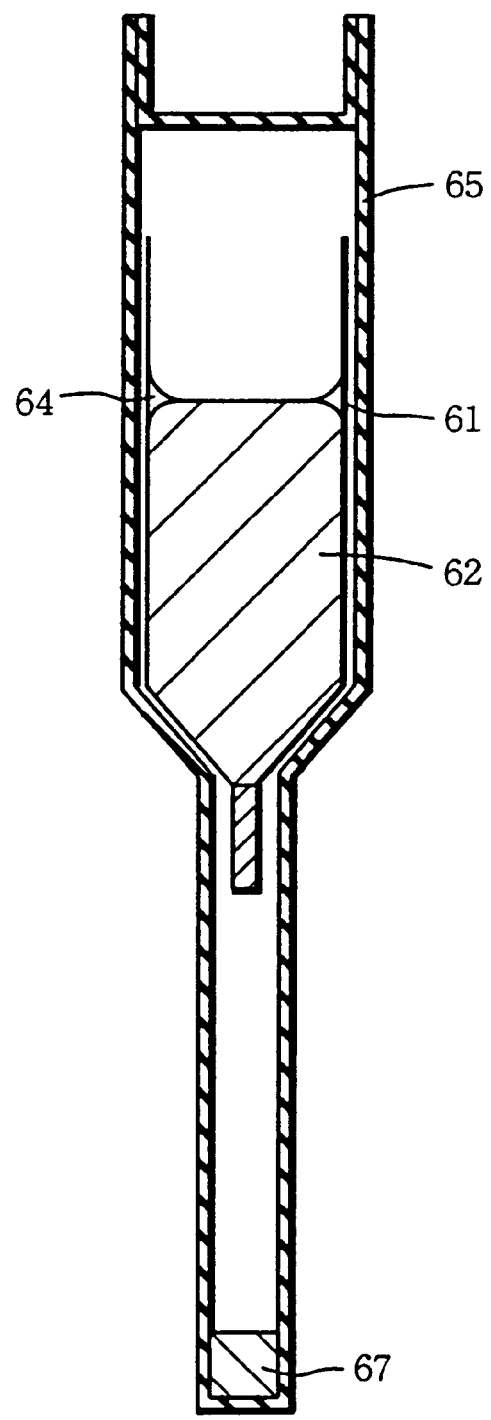
FIG. 7 is a diagram for describing a method of preparing a carbon-doped group III–V compound semiconductor crystal single crystal according to another example of prior art.
Figure 8:
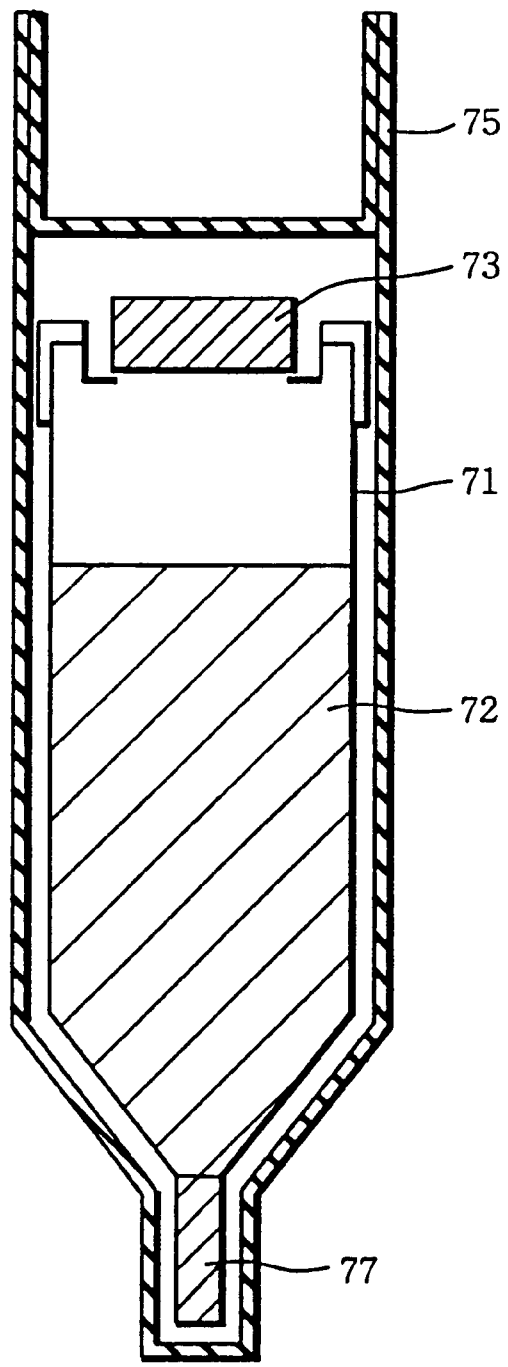
FIG. 8 is a diagram for describing a method of preparing a carbon-doped group III–V compound semiconductor crystal single crystal according to a further example of prior art.

In the present specification, the "shoulder" and "tail" of a crystal corresponds to the relevant portions shown in FIG. 5.

The role of solid arsenic (As) sealed under reduced pressure in the quartz ampoule in the present example is set forth in the following.

The dissociation pressure at the melting point of GaAs is approximately 1 atm. When GaAs is melted, the airtight vessel is filled with As vapor of approximately 1 atm at the temperature of the melting point. This As vapor is generated as a result of the GaAs melt being decomposed. Therefore, the composition of the GaAs melt is shifted from the original composition of Ga:As=1:1 to Ga rich composition. By sealing solid arsenic in the quartz ampoule in addition to GaAs, the shift from the composition of Ga:As=1:1 caused by decomposition of the GaAs melt can be suppressed.

EXAMPLE 2

Figure 3:
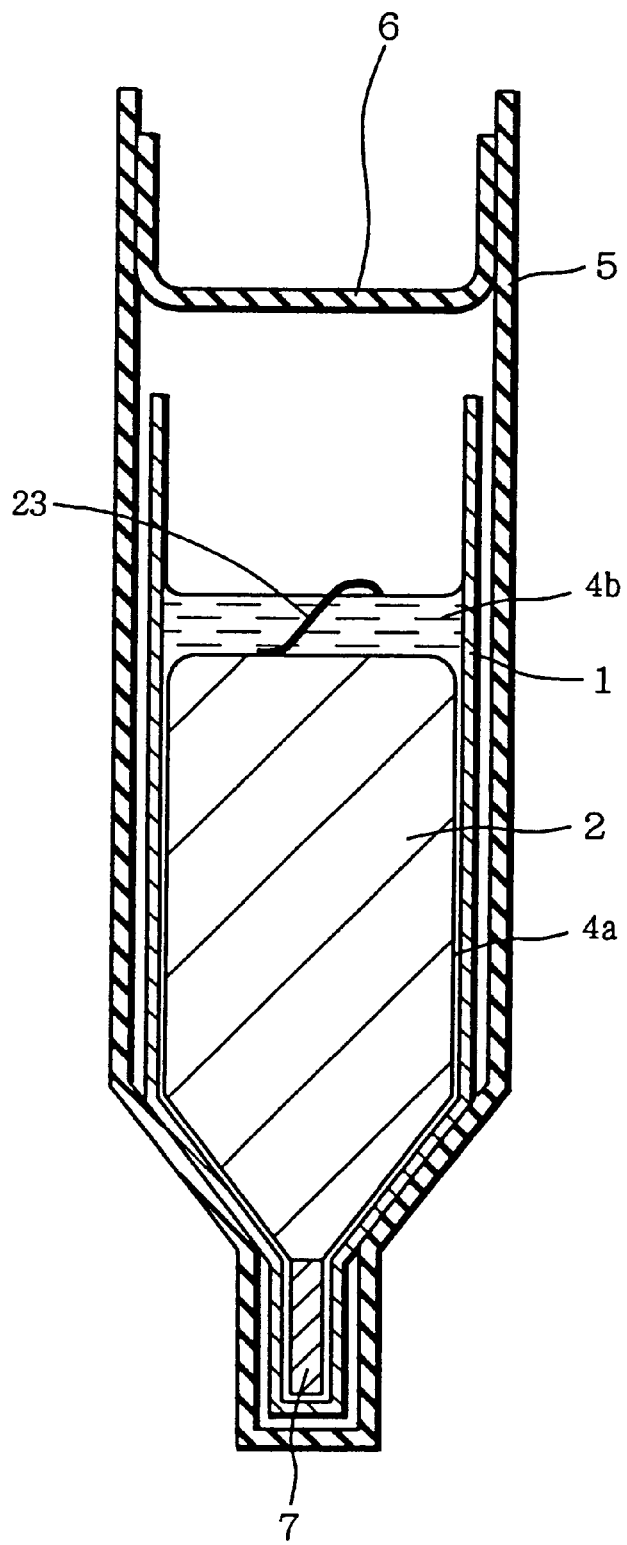
FIG. 3 is a diagram for describing another example of a method of preparing a group III–V compound semiconductor crystal according to the present invention.

FIG. 3 is a diagram for describing another example of a method of preparing a group III–V compound semiconductor crystal of the present invention.

Referring to FIG. 3, GaAs polycrystalline raw material 2, carbon fiber 23 subjected to heat treatment under reduced pressure in advance, boron oxide 4, and a seed crystal 7 were placed in a pBN crucible 1. Seed crystal 7 was placed at the bottom portion of the crucible 1. In crucible 1, arrangement was provided so that carbon fiber 23 and boron oxide 4 were brought into contact with each other and also boron oxide 4 and raw material 2 were brought into contact with each other when the raw material was melted.

Crucible 1 was inserted in a quartz ampoule 5 together with solid arsenic. Quartz ampoule 5 was sealed under reduced pressure with a quartz cap 6.

Respective conditions of Example 2 are shown in the following Table 3.

TABLE 3

| GaAs polycrystal (raw material) | 10 kg used |
|---|---|
| Carbon fiber | Average diameter 5–8 μm, 40 mg used, Heat treatment at 800° C. for 3 hours at the pressure of $10^{-7}$ Torr |
| $B_2O_3$ | Water concentration 70 wt ppm, 100 g used |
| pBN crucible | Inner diameter 105 mm, entire length 400 mm |
| Solid arsenic | 1.5 g used |

Quartz ampoule 5 was heated at the rate of approximately 120° C./hour by a heater 8 using a vertical furnace 50, as shown in FIG. 2.

During the process of heating, boron oxide 4 was softened and melted. Also, GaAs polycrystalline raw material 2 was melted.

At this time point, boron oxide 4 was present as a film 4a having a thickness of not more than 1 mm between pBN crucible 1 and GaAs melt 2. The remainder of boron oxide 4 covered the upper surface of the GaAs melt. This boron oxide layer 4b covering the upper surface of GaAs melt 2 was approximately 5 mm. The carbon fiber 23 was partially dispersed in boron oxide layer 4b on GaAs melt 2, and partially floated. Furthermore, a portion of carbon fiber 23 was present also at the proximity of the interface between GaAs melt 2 and boron oxide layer 4b.

Then, the condition mentioned above was kept for approximately 12 hours.

Then, heater 8 was moved upwards at the rate of 3 mm/hour, whereby solidification started from the portion of seed crystal 7. Thus, a single crystal was grown. The characteristics of the obtained single crystal are shown in the following Table 4.

TABLE 4

| Crystal diameter | | 105 mm |
|---|---|---|
| Length of φ105 mm portion | | 200 mm |
| Carbon concentration | Shoulder | $6.5 \times 10^{15}$ cm$^{-3}$ |
| | Tail | $7.0 \times 10^{15}$ cm$^{-3}$ |
| Resistivity | Shoulder | $4.1 \times 10^8$ Ωcm |
| | Tail | $5.0 \times 10^8$ Ωcm |
| Dislocation density | Shoulder | 800 cm$^{-2}$ |
| | Tail | 1500 cm$^{-2}$ |

EXAMPLE 3

A carbon-doped GaAs single crystal was grown using 20 mg of carbon fiber similar to that of Example 2.

The other conditions of the experiment are identical to those of Example 2, and their description will not be repeated.

The characteristics of the obtained single crystal are shown in the following Table 5.

TABLE 5

| Crystal diameter | | 105 mm |
|---|---|---|
| Length of φ105 mm portion | | 200 mm |
| Carbon concentration | Shoulder | $2.3 \times 10^{15}$ cm$^{-3}$ |
| | Tail | $2.2 \times 10^{15}$ cm$^{-3}$ |
| Resistivity | Shoulder | $8.8 \times 10^7$ Ωcm |
| | Tail | $8.4 \times 10^7$ Ωcm |
| Dislocation density | Shoulder | 1000 cm$^{-2}$ |
| | Tail | 1800 cm$^{-2}$ |

EXAMPLE 4

A carbon-doped GaAs single crystal was grown using 7.5 mg of carbon fiber similar to those of Examples 2 and 3.

The other conditions are identical to those of Examples 2 and 3, and their description will not be repeated.

The characteristics of the obtained single crystal are shown in the following Table 6.

TABLE 6

| Crystal diameter | | 105 mm |
|---|---|---|
| Length of φ105 mm portion | | 200 mm |
| Carbon concentration | Shoulder | $1.3 \times 10^{15}$ cm$^{-3}$ |
| | Tail | $1.2 \times 10^{15}$ cm$^{-3}$ |
| Resistivity | Shoulder | $2.5 \times 10^7$ Ωcm |
| | Tail | $2.3 \times 10^7$ Ωcm |
| Dislocation density | Shoulder | 1500 cm$^{-2}$ |
| | Tail | 2000 cm$^{-2}$ |

It is appreciated from Examples 2, 3 and 4 that the carbon concentration in the crystal can easily be adjusted by just adjusting the amount of solid carbon to be doped according to the present invention.

EXAMPLE 5

Figure 4:
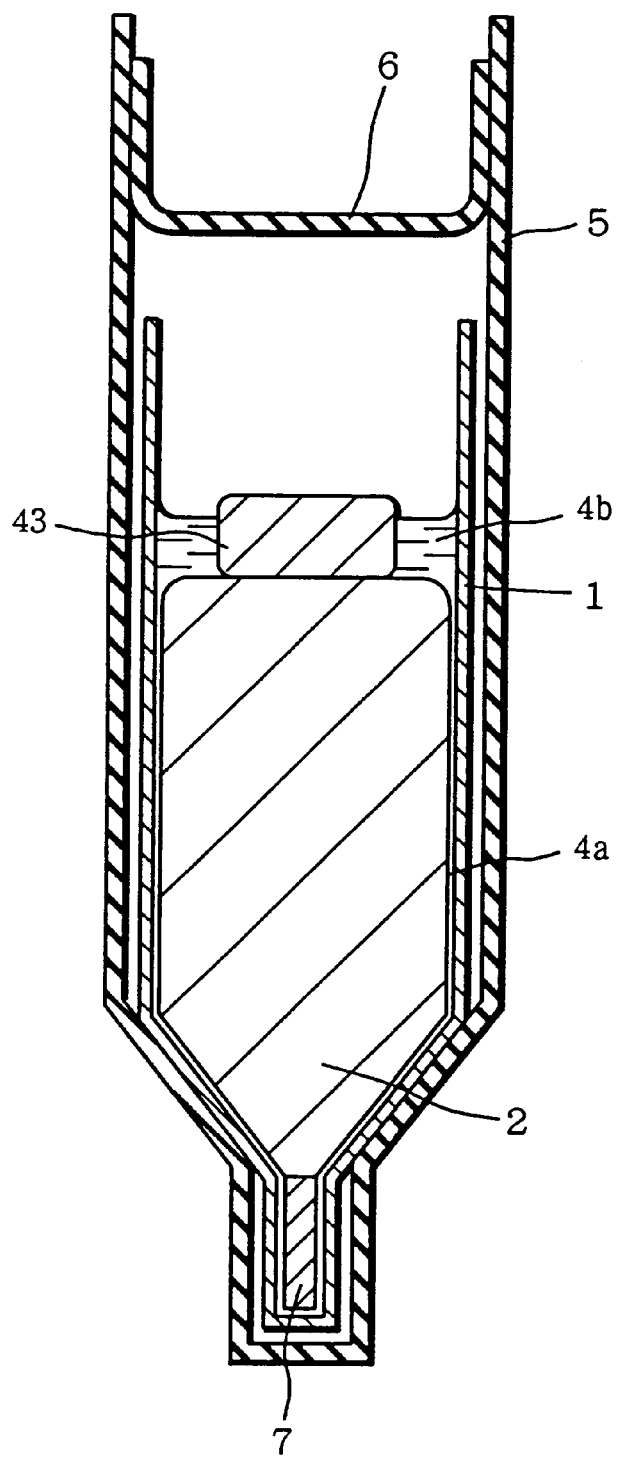
FIG. 4 is a diagram for describing a further example of a method of preparing a group III–V compound semiconductor crystal according to the present invention.

FIG. 4 is a diagram for describing another example of a method of preparing a group III–V compound semiconductor crystal according to the present invention.

Referring to FIG. 4, GaAs polycrystalline raw material 2, a disk 43 made of sintered carbon powder subjected in advance to a heat treatment under reduced pressure, boron oxide 4, and a seed crystal 7 were placed in a pBN crucible 1. Seed crystal 7 was placed at the bottom portion of the crucible 1. In crucible 1, arrangement was provided so that carbon disk 43 and boron oxide 4 were brought into contact with each other, and also boron oxide 4 and raw material 2 were brought into contact with each other when the raw material was melted.

This crucible 1 was inserted in a quartz ampoule 5 together with solid arsenic. Quartz ampoule 5 was sealed under reduced pressure using quartz cap 6.

Respective conditions of example 4 are indicated in the following Table 7.

TABLE 7

| GaAs polycrystalline raw material | 3 kg used |
|---|---|
| Carbon disk | Diameter 30 mm, thickness 10 mm used Heat treatment at 1500° C. for 12 hours at the pressure of 1 Torr |
| $B_2O_3$ | Water concentration 300 wt ppm, 50 g used |
| pBN crucible | Inner diameter 80 mm, entire length 250 mm |
| Solid arsenic | 1 g used |

The above-described quartz ampoule 5 was heated at the rate of approximately 200° C./hour by heater 8 using vertical furnace 50.

During the process of heating, boron oxide 4 was softened and melted. Also, GaAs polycrystalline raw material 2 was melted.

At this time point, boron oxide 4 was present as a film 4a having a thickness of less than 1 mm between pBN crucible 1 and GaAs melt 2. The remainder of boron oxide 4 covered the upper surface of GaAs melt 2. The thickness of the boron oxide layer 4b covering the upper surface of GaAs melt 2 was approximately 6 mm. Carbon disk 43 had its bottom surface in contact with raw material melt 2, and its top surface exposed to the ambient. The side surface thereof was surrounded by boron oxide layer 4b.

The condition mentioned above was kept for approximately 6 hours.

Then, heater 8 was moved upwards at the rate of 4 mm/hour, whereby solidification started from the portion of seed crystal 7. Thus, a single crystal was grown. The characteristics of the obtained single crystal are shown in the following Table 8.

TABLE 8

| Crystal diameter | 80 mm | |
|---|---|---|
| Length of φ80 mm portion | 100 mm | |
| Carbon concentration | Shoulder | $6.8 \times 10^{15}$ cm$^{-3}$ |
| | Tail | $7.1 \times 10^{15}$ cm$^{-3}$ |
| Resistivity | Shoulder | $4.5 \times 10^8$ Ωcm |
| | Tail | $5.2 \times 10^8$ Ωcm |
| Dislocation density | Shoulder | 1200 cm$^{-2}$ |
| | Tail | 1500 cm$^{-2}$ |

In a semi-insulating GaAs crystal, the resistivity is one of the most important characteristics. It is preferable that variation in resistivity is smaller. Furthermore, since this resistivity value depends on the carbon concentration in the GaAs crystal, variation in the carbon concentration in the crystal should be as small as possible.

In the above-described examples where carbon fiber or bulk carbon was used as the solid carbon, the carbon was doped substantially uniformly from the shoulder to the tail of the crystal. It is appreciated that carbon fiber and bulk carbon are preferable as solid carbon sources. The shape of bulk carbon is not limited to the disk shape shown in Example 5, and any shape can be used. Also, bulk carbon is preferably a sintered compact of carbon powder.

Comparison of the effect of the present invention depending upon difference in the type of solid carbon is shown in the following Table 9.

TABLE 9

Difference in effect among powder, fiber, and bulk carbon

| Type of solid carbon | Carbon distribution in a crystal from shoulder to tail |
|---|---|
| Carbon powder | Gradual decrease of carbon from shoulder to tail |
| Carbon fiber | Uniform distribution of carbon from shoulder to tail |
| Bulk carbon | Uniform distribution of carbon from shoulder to tail |

Comparison of the carbon concentration in a GaAs crystal between the present invention and the prior art is shown in the following Table 10.

TABLE 10

Comparison of carbon concentration in GaAs crystal

| | | | Carbon concentration (cm$^{-3}$) | |
|---|---|---|---|---|
| | | | Shoulder | Tail |
| Present invention | Carbon powder | | $1.4 \times 10^{15}$ | $0.8 \times 10^{15}$ |
| | Carbon fiber | Example 2 | $6.5 \times 10^{15}$ | $7.0 \times 10^{15}$ |
| | | Example 3 | $2.3 \times 10^{15}$ | $2.2 \times 10^{15}$ |
| | | Example 4 | $1.3 \times 10^{15}$ | $1.2 \times 10^{15}$ |
| | Carbon disk | | $6.8 \times 10^{15}$ | $7.1 \times 10^{15}$ |
| Prior art | Prior art 2 | | $0.5 \times 10^{15}$ | $0.4 \times 10^{15}$ |
| | Prior art 3 | | $2.2 \times 10^{15}$ | $1.4 \times 10^{15}$ |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing a carbon-doped group III–V compound semiconductor crystal, comprising the steps of:

placing a compound raw material, solid carbon, and a boron oxide substance into a crucible or a boat, sealing said crucible or boat containing said compound Law material, said solid carbon, and said boron oxide substance within an airtight vessel formed of a gas impermeable material, heating and melting said compound raw material in said crucible or said boat sealed within said airtight vessel, and solidifying said melted compound raw material to grow a carbon-doped compound semiconductor crystal, wherein an amount of said solid carbon placed into said crucible or said boat is larger than an amount of carbon doped into said compound semiconductor crystal.

2. The method of preparing a carbon-doped group III–V compound semiconductor crystal according to claim 1, further comprising a step of heating and melting said boron oxide substance and having said melted boron oxide substance in contact with at least a portion of said solid carbon, during said step of heating and melting said compound raw material.

3. The method of preparing a carbon-doped group III–V compound semiconductor crystal according to claim 1, wherein said gas impermeable material comprises a material selected from the group consisting of quartz and pBN.

4. The method of preparing a carbon-doped group III–V compound semiconductor crystal according to claim 1, wherein said boron oxide substance comprises boron oxide and water.

5. The method of preparing a carbon-doped group III–V compound semiconductor crystal according to claim 4, wherein said boron oxide substance contains 10–500 wt ppm of said water.

6. The method of preparing a carbon-doped group III–V compound semiconductor crystal according to claim 1, wherein said amount of said solid carbon placed into said crucible or said boat is at least 10 times larger than said amount of carbon doped into said compound semiconductor crystal.

7. The method of preparing a carbon-doped group III–V compound semiconductor crystal according to claim 1, further comprising a step of subjecting said solid carbon to a heat treatment under reduced pressure before placing said solid carbon into said crucible or said boat.

8. The method of preparing a carbon-doped group III–V compound semiconductor crystal according to claim 7, comprising carrying out said heat treatment for 1 hour to 12 hours at a temperature of 500° C.–2000° C. under a pressure of 1 Torr $-1\times10^{-8}$ Torr.

9. The method of preparing a carbon-doped group III–V compound semiconductor crystal according to claim 1, further comprising a step of maintaining said melted compound raw material in a melted state for a certain time period before said step of solidifying said melted raw material to grow said crystal.

10. The method of preparing a carbon-doped group III–V compound semiconductor crystal according to claim 9, wherein said step of maintaining said melted compound raw material in a melted state is carried out for 3–72 hours.

11. The method of preparing a carbon-doped group III–V compound semiconductor crystal according to claim 1, wherein said solid carbon comprises powder carbon.

12. The method of preparing a carbon-doped group III–V compound semiconductor crystal according to claim 11, wherein said powder solid carbon has a grain size of not more than 100 $\mu$m.

13. The method of preparing a carbon-doped group III–V compound semiconductor crystal according to claim 1, wherein said solid carbon comprises fiber carbon.

14. The method of preparing a carbon-doped group III–V compound semiconductor crystal according to claim 13, wherein said fiber solid carbon has an average diameter of not more than 50 $\mu$m.

15. The method of preparing a carbon-doped group III–V compound semiconductor crystal according to claim 1, wherein said solid carbon comprises bulk carbon.

16. The method of preparing a carbon-doped group III–V compound semiconductor crystal according to claim 15, wherein said bulk carbon has a disk shape with a disk diameter smaller than an inner diameter of said crucible.

17. The method of preparing a carbon-doped group III–V compound semiconductor crystal according to claim 15, wherein said bulk carbon comprises a sintered compact of carbon powder.

18. A method of preparing a carbon-doped group III–V compound semiconductor crystal according to claim 1, wherein said crucible or said boat comprises pBN.

19. The method of preparing a carbon-doped group III–V compound semiconductor crystal according to claim 1, wherein said compound raw material comprises GaAs, and wherein said compound semiconductor crystal comprises a GaAs crystal.

20. The method of preparing a carbon-doped group III–V compound semiconductor crystal according to claim 2, further comprising having said melted boron oxide substance in contact with at least a portion of said melted compound raw material, during said step of heating and melting said compound raw material.

21. The method of preparing a carbon-doped group III–V compound semiconductor crystal according to claim 1, further comprising selecting a target amount of said carbon to be doped into said compound semiconductor crystal, and adjusting said amount of said solid carbon placed into said crucible or said boat so as to responsively achieve said target amount of said carbon to be doped into said semiconductor crystal.

22. The method of preparing a carbon-doped group III–V compound semiconductor crystal according to claim 1, carried out such that said carbon-doped compound semiconductor crystal has a variation of carbon concentration of not more than 8⅓% between a lowest carbon concentration and a highest carbon concentration, relative to said lowest carbon concentration.

* * * * *

UNITED STATES PATENT AND TRADEMARK OFFICE
CERTIFICATE OF CORRECTION

PATENT NO. : 6,007,622
DATED : December 28, 1999
INVENTOR(S) : Kawase et al.

It is certified that error appears in the above-identified patent and that said Letters Patent is hereby corrected as shown below:

Title page,
Item [57] ABSTRACT,
Line 8, after "crucible" insert -- within an airtight vessel formed of a --;

Column 1,
Line 7, after "crystal" replace ". Particularly," by -- , and particularly a carbon-doped --;
Lines 8, 10 and 15, cancel the entire line;
Line 9, after "crystal" replace "in which" by -- . --;
Line 12, after "prior" replace "arts as set forth in" by -- art --;
Line 13, replace the line to read: -- methods for preparing a carbon-doped group --;
Line 14, after "crystal" replace "in which carbon is" by -- , as set forth in the following described publications. --;
Line 16, before "Japanese" delete "In";
Line 17, after "hereinafter)" replace "," by -- discloses --;
Line 19, after "method)", insert -- . --;
Line 20, please cancel the entire line;
Delete the paragraph spacing between lines 20 and 21;
Line 21, delete the indentation;
Delete the paragraph spacing between lines 22 and 23;
Line 23, (actual line count) delete the indentation;
Line 34, (actual line count), after "in" insert -- the formation of --, after "like" replace "to be" by -- which is --;
Delete the paragraph spacing between lines 35 and 36 (actual line count);
Line 36, delete the indentation;
Line 40, before "Journal" replace "In" by -- The --;
Line 42, after "hereinafter)" replace "," by -- discloses --;
Line 44, after "method)" delete "is disclosed";
Delete the paragraph spacing between lines 44 and 45;
Line 45, delete the indentation;
Delete the paragraph spacing between lines 46 and 47;
Line 47, delete the indentation, after "62" replace "having" by -- which has --; after "doped" insert -- therein --;
Line 48, after "advance," insert -- and which was --, after "method" insert -- , --;
Line 55(actual line counter), after "containing" insert -- 200ppm of --, after "water" delete "of 200ppm";
Delete the paragraph between cols. 1 and 2;

UNITED STATES PATENT AND TRADEMARK OFFICE
CERTIFICATE OF CORRECTION

PATENT NO. : 6,007,622  
DATED : December 28, 1999  
INVENTOR(S) : Kawase et al.

Page 2 of 7

It is certified that error appears in the above-identified patent and that said Letters Patent is hereby corrected as shown below:

Column 2,  
Line 1, delete the indentation, before "U.S." delete "In";  
Line 2, after "hereinafter)" replace "," by -- dis-closes --, after "preparing" insert -- a --;  
Line 3, after "method insert -- . --;  
Line 4, cancel the entire line;  
Delete the paragraph spacing between lines 4 and 5;  
Line 5, delete the indentation; after "preparing" insert -- a --;  
Delete the paragraph spacing between lines 14 and 15;  
Line 21, (actual line count), delete the paragraph spacing between lines 21 and 22;  
Line 22, delete the indentation;  
Line 28, after "preparing" insert -- the same. --;  
Line 29, before "This", delete "thereof.";  
Line 30, after "contained", replace "having" by -- in --;  
Line 34, after "concentration" delete "of";  
Line 36, after "art" insert -- methods --;  
Line 42, after "since" insert -- a --;  
Line 45, after "oxygen," replace "that" by -- which --;  
Line 47, after "gas." replace "There was" by -- As a result, there is --;  
Line 63, after "preparing" replace "in" by -- , with --;  
Line 64, after "ibility" insert -- , --, after "a" insert -- carbon-doped --; after crystal, replace "of" by -- having --;  
Line 65, after characteristics" insert -- and --;  
Line 66, after "removed" insert -- therefrom --, before "in" delete "and";

Column 3,  
Line 1, before "aspect" replace "According to an" by -- One --, after "invention" replace "," by -- provides --;  
Line 2, after "crystal", insert -- . --;  
Line 3, before "This", delete "is provided".  
Line 4, after "doped" insert -- therein --;  
Lines 9 and 11, after "compound" insert -- raw --;  
Line 20, after "the" insert -- initial --;  
Line 21, after "doped" insert -- into the material --;  
Line 23, after "obtained" replace "in" by -- with --;  
Line 30, after "Preferably," insert -- the --;  
Delete the paragraph spacing between lines 30 and 31;

UNITED STATES PATENT AND TRADEMARK OFFICE
CERTIFICATE OF CORRECTION

PATENT NO. : 6,007,622
DATED : December 28, 1999
INVENTOR(S) : Kawase et al.

It is certified that error appears in the above-identified patent and that said Letters Patent is hereby corrected as shown below:

Line 31, delete the indentation;
Line 34, delete the paragraph spacing between lines 35 and 36;
Line 36, before "oxide", replace "Boron" by -- The boron -- after "contains" delete "water of"; after "ppm" replace "." by -- of water. --;
Line 38, after "filled" insert -- into the crucible --; after "carbon" insert -- to be --;
Line 39, delete the paragraph spacing between lines 39 and 40;
Line 42, after "Furthermore," insert -- an additional amount of carbon must be supplied to make up for the --, after "of" (first occurrence) delete "the";
Line 43, after "carbon" (first occurrence) replace "at the" by -- in --, after "compound", replace "must" by -- . --;
Line 44, before "Thus," delete "must be supplied.";
Line 47, delete the paragraph spacing between lines 46 and 47;
Line 52, delete the paragraph spacing between lines 52 and 53;
Line 53, delete the indentation; after "process," replace "the" by -- any --, after "in" insert -- the --;
Line 54, delete the paragraph spacing between lines 54 and 55;
Line 55, delete the indentation, after "applying" replace "a" by -- the --, after "treatment" replace "on" by -- to the --;
Line 63, before "change" insert -- further --;

Column 4,
Delete the paragraph spacing between lines 3 and 4;
Line 4, delete the indentation;
Line 12, after "those" insert -- samples --;
Line 25, after "little" insert -- further --;
Delete the paragraph spacing between lines 31 and 32;
Line 32, delete the indentation;
Line 38, (actual line count), after "like" insert -- , --, before "powder" delete "used", after "powder" insert -- being used --;
Delete the paragraph spacing between lines 41 and 42 (actual line count);
Line 43, delete the indentation;
Line 46, (actual line count), after "oxide" insert -- which is --;
Line 47, (actual line count), after "state" replace "where" by -- in which --;
Delete the paragraph spacing between lines 49 and 50 (actual line count);
Line 50, delete the indentation;
Delete the paragraph spacing between lines 58 and 59 (actual line count);
Line 59, delete the indentation;

UNITED STATES PATENT AND TRADEMARK OFFICE
CERTIFICATE OF CORRECTION

PATENT NO. : 6,007,622
DATED : December 28, 1999
INVENTOR(S) : Kawase et al.

It is certified that error appears in the above-identified patent and that said Letters Patent is hereby corrected as shown below:

Delete the paragraph spacing between lines 61 and 62, (actual line count);
Line 62, delete the indentation; after "in" insert -- the --;
Line 63, (actual line count), after "oxide" replace "that" by -- which --, after "state" replace "where" by -- in which --;
Line 65, (actual line count), after "above" insert -- the --, after "oxide", replace "to" by -- and thereby --;

Column 5,
Line 1, before "solid" insert -- the --;
Delete the paragraph spacing between lines 2 and 3;
Line 3, delete the indentation;
Delete the paragraph spacing between lines 12 and 13;
Line 13, delete the indentation;
Delete the paragraph spacing between lines 17 and 18;
Line 18, delete the indentation;
Delete the paragraph spacing between lines 23 and 24;
Line 23, delete the indentation; after "constituent" replace "element" by -- elements --;
Line 25, after "crucible" replace "to induce" by -- and induces --;
Lines 52, 56 and 59, after "semiconductor", delete "crys-";
Lines 53, 57 and 60, before "single", delete "tal";
Line 61, before "DESCRIPTION" insert -- DETAILED --;
Delete the paragraph spacing between Col. 5, line 67 and Col. 6, line 1;

Column 6,
Line 1, delete the indentation;
Line 2, after "powder 13" insert -- which has been --;
Line 3, after "4" insert -- forming a boron oxide layer 4b and a boron oxide film 4a as described below --;
Line 4, after "crystal" insert -- 7 --;
Line 6, after "crucible 1," replace "arrangement was provided so" by -- the materials were so arranged --;
Line 31, after "heater "8" replace "using" by -- in --;
Delete the paragraph spacing between lines 31 and 32;
Line 32, delete the indentation;
Delete the paragraph spacing between lines 34 and 35;
Line 35, delete the indentation;
Line 38, after "melt 2" delete ". The";

UNITED STATES PATENT AND TRADEMARK OFFICE
CERTIFICATE OF CORRECTION

PATENT NO. : 6,007,622
DATED : December 28, 1999
INVENTOR(S) : Kawase et al.

It is certified that error appears in the above-identified patent and that said Letters Patent is hereby corrected as shown below:

Line 39, before "boron", replace "thickness of the" by -- as a --, after "4b" delete "covering the upper";
Line 40, before "approximately" replace "surface of GaAs melt 2 was" by -- having a thickness of --;
Line 41, after "4b" replace "." by -- , as shown also in Fig. 1. --;
Line 42, after "was" replace "kept" by -- maintained --;
Delete the paragraph spacing between lines 43 and 44 (actual line count);
Line 44, (actual line count), delete the indentation;
Line 47, (actual line count), after "crystal" replace "is" by -- are --;
Table 2, line 2, after "crystal" replace "corresponds" by -- correspond --;
Delete the paragraph spacing between lines 65 and 66;
Line 66, delete the indentation;

Column 7,
Delete the paragraph spacing between lines 14 and 15;
Line 15, delete the indentation;
Line 17, after "oxide 4" insert -- forming a boron oxide layer 4b and a boron oxide film 4a as described below --;
Line 19, after "crucible 1," delete "arrangement";
Line 20, before "so" replace "was provided" by -- the materials were arranged --;
Delete the paragraph spacing between lines 24 and 25;
Line 25, delete the indentation;
Delete the paragraph spacing between lines 27 and 28;
Line 28, delete the indentation;
Line 44, after "heater 8" replace "using" by -- in --;
Delete the paragraph spacing between lines 45 and 46;
Line 46, delete the indentation;
Delete the paragraph spacing between lines 49 and 50;
Line 50, delete the indentation;
Line 53, after "melt" replace ". This" by -- 2 as a --;
Line 54, replace the line to read: -- oxide layer 4b --;
Line 55, before "approximately" replace "was" by -- having a thickness of --;
Line 60, after "was" replace "kept" by -- maintained --;
Delete the paragraph spacing between lines 61 and 62;
Line 62, delete the indentation;

UNITED STATES PATENT AND TRADEMARK OFFICE
CERTIFICATE OF CORRECTION

PATENT NO. : 6,007,622
DATED : December 28, 1999
INVENTOR(S) : Kawase et al.

It is certified that error appears in the above-identified patent and that said Letters Patent is hereby corrected as shown below:

Column 8,
Delete the paragraph spacing between lines 15 and 16;
Line 16, delete the indentation, after "experiment" replace "are" by -- were --;
Delete the paragraph spacing between lines 18 and 19;
Line 19, delete the indentation;
Delete the paragraph spacing between lines 35 and 36;
Line 36, delete the indentation, after "conditions" replace "are" by -- were --;
Delete the paragraph spacing between lines 37 and 38;
Line 38, delete the indentation;
Delete the paragraph spacing between lines 60 and 61;
Line 61, delete the indentation;
Line 64, after "oxide 4" insert -- that will form a boron oxide layer 4b and a boron oxide film 4a as described below --;
Line 66, before "so" replace "arrangement was provided" by -- the materials were arranged --;

Column 9,
Delete the paragraph spacing between lines 6 and 7;
Line 7, delete the indentation, after "of" replace "example 4" by -- example 5 --;
Line 22, after "heater 8" replace "using" by -- in a --;
Delete the paragraph spacing between lines 23 and 24;
Line 24, delete the indentation;
Delete the paragraph specing between lines 26 and 27;
Line 27, delete the indentation;
Line 30, after "melt 2" replace ". The thickness of the" by -- as a --;
Line 31, replace the line to read: -- oxide layer 4b --;
Line 32, before "approximately" replace "was" by -- having a thickness of --;
Line 36, after "was" replace "kept" by -- maintained --;
Delete the paragraph spacing between lines 37 and 38;
Line 38, delete the indentation;

Column 10,
Line 2, after "upon" replace "difference" by -- differences --;
Line 47, before "material,", replace "Law" by -- raw --;

UNITED STATES PATENT AND TRADEMARK OFFICE
CERTIFICATE OF CORRECTION

PATENT NO. : 6,007,622
DATED : December 28, 1999
INVENTOR(S) : Kawase et al.

It is certified that error appears in the above-identified patent and that said Letters Patent is hereby corrected as shown below:

Column 11,
Line 42, after "powder", delete "solid";

Column 12,
Line 3, after "fiber", delete "solid".

Signed and Sealed this

Twenty-seventh day of November, 2001

Attest:

*Attesting Officer*

NICHOLAS P. GODICI
*Acting Director of the United States Patent and Trademark Office*